United States Patent [19]

Hinrichs

[11] Patent Number: 5,274,577
[45] Date of Patent: Dec. 28, 1993

[54] SYSTEM FOR LINEARIZING A NON-LINEAR SENSOR OUTPUT

[75] Inventor: Karl Hinrichs, Downey, Calif.

[73] Assignee: Newport Electronics, Inc., Santa Ana, Calif.

[21] Appl. No.: 939,832

[22] Filed: Sep. 2, 1992

Related U.S. Application Data

[63] Continuation of Ser. No. 594,073, Oct. 9, 1990, abandoned.

[51] Int. Cl.$^5$ .............................................. G06F 15/20
[52] U.S. Cl. .............................. 364/571.04; 364/573; 364/577; 364/723
[58] Field of Search ........................ 341/118, 120; 364/571.04, 573, 577, 723

[56] References Cited

U.S. PATENT DOCUMENTS

| | | | |
|---|---|---|---|
| 3,699,318 | 10/1972 | Underkoffler et al. | 364/573 X |
| 3,953,718 | 4/1976 | Cooke | 364/573 |
| 4,064,396 | 12/1977 | Panarello | 364/573 |
| 4,200,933 | 4/1980 | Nickel et al. | 364/573 X |
| 4,282,578 | 8/1981 | Payne et al. | 364/573 |
| 4,423,408 | 12/1983 | Place | 341/120 X |
| 4,812,747 | 3/1989 | Gale et al. | 364/573 X |
| 4,912,397 | 3/1990 | Gale et al. | 364/573 X |
| 5,196,851 | 3/1993 | Patel et al. | 341/118 X |

Primary Examiner—Edward R. Cosimano
Attorney, Agent, or Firm—Bruce E. Hosmer; Howard S. Reiter

[57] ABSTRACT

A processor is described for monitoring a sensor whose output signal follows a nonlinear curve in response to a linear change in a monitored phenomenon. The processor converts the sensor signal to a linear output proportional or equal to the phenomenon being monitored. The processor includes a memory for storing a table which includes a starting data point value S on the curve, a starting slope value S' to another data point on the curve, a starting curvature value S" for a succession of the data points on the curve and a plurality of rate of change of curvature values S''' for the curve. The values of S''' for a first region of the curve are calculated based on an initial output signal interval between data point values. The values of S''' for each succeeding region of the curve are based on increasing, by a preselected factor, the signal interval between data point values. The processor includes a calculation device for computing repeated aditons of the S', S", S''' values. An addition occurs when the sensor output signal rises above a predetermined signal interval value between data points. The processor also includes a controller which increases, by a preselected factor, the predetermined sensor signal interval value each time the output signal enters a succeeding region of the curve. Thus, as the data points move up the curve, they become increasingly farther apart, but accuracy does not suffer as such data points reside on the more regular (steady curvature, for instance) regions of the curve. Data storage requirements are thus minimized.

7 Claims, 7 Drawing Sheets

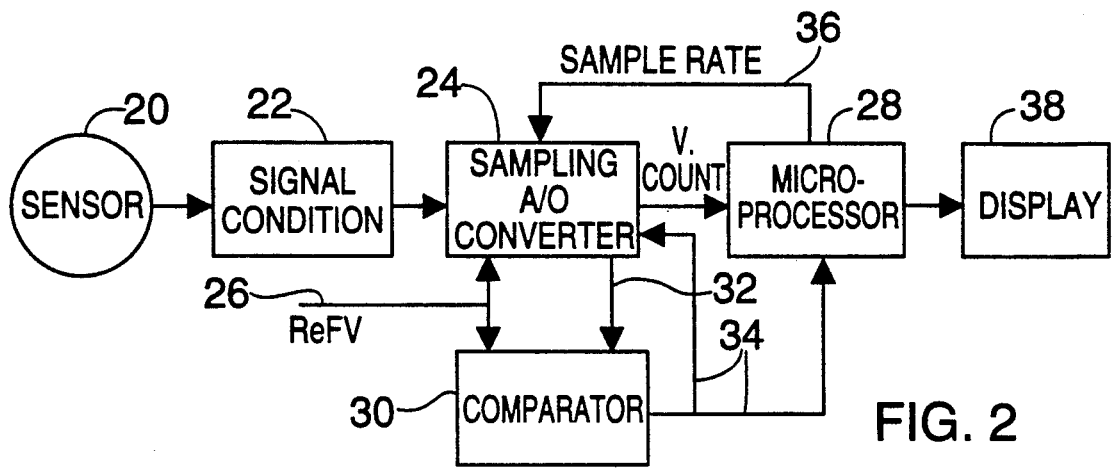
FIG. 2
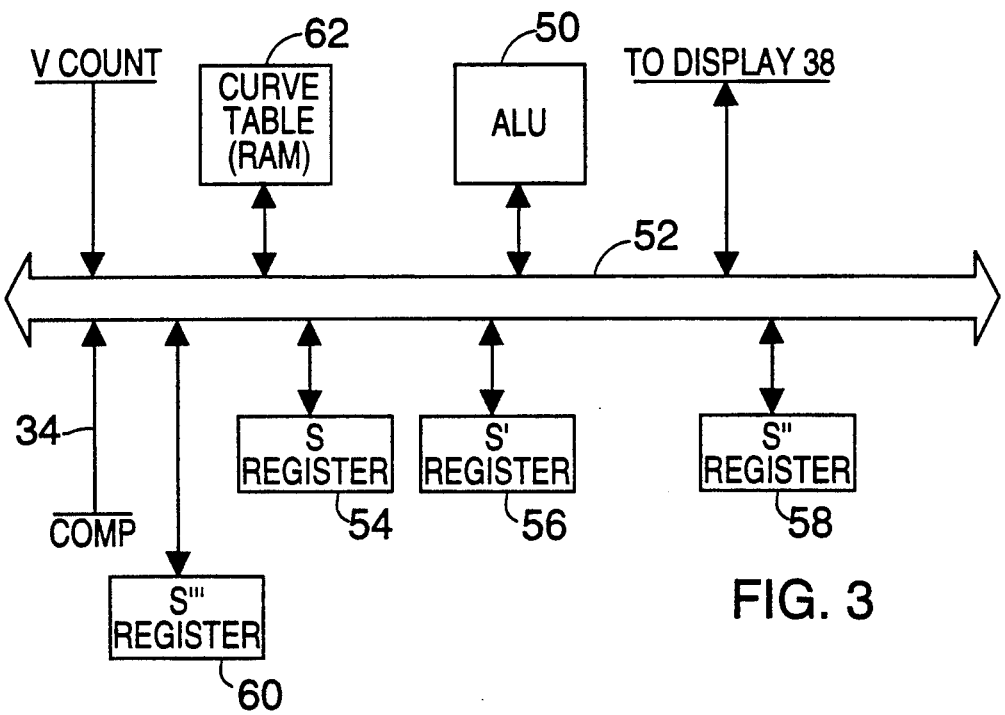
FIG. 3
CURVE TABLE
| REGION 1 |
| --- |
| $S_0, S_1', S_2'', S_3''', S_5''', S_6''', S_7''', (=S_8''', S_9''')$ |
| $S_{10}''', (=S_{11,12}'''), \ldots S_{39}'''$ ... $S_{75}'''$ ... $S_{111}'''$ ... $S_{159}'''$ ... |
(TRIAD markers; REGION II, REGION III, REGION IV, ETC.)
FIG. 4

SYSTEM FOR LINEARIZING A NON-LINEAR SENSOR OUTPUT

This application is a continuation of application Ser. No. 07/594,073, filed Oct. 9, 1990, now abandoned.

FIELD OF THE INVENTION

This invention relates to data conversion systems and, more particularly, to a system for converting the output of a sensor, whose output follows a nonlinear response curve, to a system output of linearized readings.

BACKGROUND OF THE INVENTION

To display the value of a physical parameter, such as temperature, pressure, etc., it is necessary to employ a transducer that responds to that parameter by changing an electrically-detectable characteristic. Such characteristics include thermocouple voltages and temperature-sensitive resistance variations. Most sensors display significant non-linearities in their outputs, i.e., sensor output voltages deviate appreciably from a linear relationship with the input phenomenon being monitored. It is well known that thermocouples and thermistors exhibit nonlinear output increments in response to linear temperature increments.

A variety of classes of devices exist for correcting such non-linearities over wide ranges of input. Systems employing analog apparatus correct such non-linearities before digitizing through the use of resistor-diode-amplifier circuits. These systems provide adequate accuracy for a limited number of sensor types over restricted input ranges. Analog linearizing systems store the required correction information in the values of resistors which set the break points between various segments of the response curve and the slope/offset peculiar to each segment of the response curve. Analog linearizers typically have eight or fewer segments, and are capable of linearizing most thermocouples, within a few degrees, over commonly-experienced input ranges.

Since the development of inexpensive microcontrollers and memory chips, digital correction techniques have supplanted many analog linearizing systems. Sophisticated algorithms exist for linearizing sensor outputs; however, in general, they require substantial amounts of memory and computing capability. Most such systems are both large and expensive and are not feasible for many commercial sensor applications. For instance, panelmeters are today manufactured with a microcontroller integral to the meter. The meter receives a sensor input, after analog conditioning, and provides an output reading of a linearized value. Microcontrollers useful with panel meters have limited amounts of available storage (ROM and RAM) for sensor response curve data points. Furthermore, while such microcontrollers can rapidly perform addition and subtraction calculations, they are relatively, slow when high-precision multiplication or division is attempted.

Microcontrollers used for sensor linearization employ various computational methods. Some sensors (e.g., resistance-temperature detectors) have outputs that can be closely approximated by a few terms of a power series; however high-precision representation of the values in a typical transducer power series can require computations out to a dozen decimal digits of resolution for up to a dozen powers of the phenomenon being sensed (e.g., temperature). With careful programming, large computers can preserve this resolution and can accurately invert such a power series. Microcontrollers suitable for panel meters however, do not posses the require-d ROM and RAM and cannot usually afford the long computation times for such complex mathematics.

An alternate approach to the power series expansion computation is to store "key" data-point pairs at selected points along a response curve and to perform interpolations when required. When the response curve is broken into a large number of such segments (more segments enable nonlinear areas of the responsive curve to be more accurately reproduced), the storage requirements for the microcontroller increase substantially. One way to reduce data storage requirements is to use regular spacing of the input data points that delimit the boundaries of each segment, so that one of the two variables can be reconstructed by counting rather than by reading a stored value. Thus, a range of possible input voltages can be divided into a number of equal segments: the incremental count output from the analog-to-digital converter is chosen to be the same between succeeding data points on the response curve.

In order to further reduce the amount of storage required in panelmeter microcontrollers, the prior art has employed a finite-difference method. That method will be described in conjunction with curve 10 shown in FIG. 1, which is an exemplary response curve of a temperature sensor. A plurality of data points $S_0$–$S_5$ are positioned along response curve 10 and each represents the digital value of the temperature at that point. The finite-difference technique employs a plurality of "derivatives" of curve 10 which may be linearly approximated by arithmetic differences. The slope $S'$ between any two data points can be defined as the ratio of the temperature difference to the voltage difference. For instance, the slopes between data points $S_0$ and $S_1$, and $S_1$ and $S_2$ are:

$$S_1' = \frac{T1 - T0}{V1 - V0} \text{ (first finite difference of segment one);}$$

and $$S_2' = \frac{T2 - T1}{V2 - V1} \text{ (first finite difference of segment two)}$$

The finite difference value of the curvature (second derivative) can then be defined as the difference between two succeeding slope values. Thus, the curvature or second finite-difference between data points $S_0$ and $S_2$, and $S_1$ and $S_3$ are expressed as follows:

$$S''_2 = S_2' - S_1'$$

(second finite-difference of the second segment); and $$S''_3 = S_3' - S_2'$$

(second finite-difference of the third segment)

The finite difference value of the third derivative or rate-of-change of curvature can then defined as the difference between two succeeding curvature values, thus:

$$S'''_3 = S''_3 - S''_2$$

(third finite difference of the third segment).

From a review of the finite-difference expressions, it can be seen, given one value, that other values can be derived by addition/subtraction actions. The use of finite-differences enables a microcontroller to replace stored values of temperature, slope and curvature with a third-order differences for each curve segment. Furthermore, while the values of temperature, first and second order difference may be numerically sizable, third-order differences (analogous to third derivatives) are generally small and usually markedly diminish as a sensor's output increases. This can be understood by realizing that as temperature increases, thermodynamic smoothing also increases, lowering the rate of change of curvature.

Using the finite-difference system, the value of temperature for any input voltage can be calculated from a table of third-finite-differences plus table-starting values of temperature, slope, and curvature (zero, first and second order differences), By repeated-addition and accumulation of values, multiplication actions are avoided and the use of less complex, faster microcontrollers is enabled.

Table values to be stored in a microcontroller for third-finite-differences can be precalculated and based on equal segment values along the response curve. This enables approximately 20 bytes per thermocouple type to be stored in the table and yet enables the accurate calculation of hundreds of individual data points over much of the temperature range of interest. In addition, however, the market requires that panel meters be adapted to receive inputs from many types of sensors, each one having a different response curve. Notwithstanding the data compaction achieved through the use of finite-differences, current cost-effective microcontrollers are unable to cope with the total storage required for excellent accuracy (e.g., all points to 0.1° C.) for full temperature ranges (e,g,, 1000° C.) for all sensor types (e.g., 12 thermocouples plus temperature-sensitive resistors).

SUMMARY OF THE INVENTION

Accordingly, it is an object of this invention to provide an improved system for linearizing sensor outputs.

It is another object of this invention to provide a high accuracy, wide-range linearization system for nonlinear sensor outputs which exhibits minimal data storage.

It is still another object of this invention to provide a linearizing system that employs a minimum number of third-finite-difference values to determine accurate data points on a wide-range nonlinear response curve.

A processor is described for monitoring a sensor whose output signal follows a nonlinear curve in response to a linear change in a monitored phenomenon. The processor converts the output signal to a linear output value proportional to the phenomenon being monitored. The processor includes memory for storing a table which includes a starting data point value $S_0$ (e.g., temperature) on the curve, a first-segment slope value S a second-segment curvature value S", and a plurality of rate of change of curvature values S'" for the curve, starting at segment three. The values of S'" for a first region of the curve are calculated based on a selected initial sensor signal interval (segment length). The values of S'" for each succeeding region of the curve are based on increasing, by a selected factor, the initial signal interval. The processor includes addition means and RAM registers for computing repeated values of S, S' and S". These additions occur when the sensor signal rises beyond the segment length. The processor also includes a controller which increases, by a factor, the predetermined signal interval value (segment length) each time the output signal enters a succeeding region of the curve. Thus, as the data points move up the curve, they become increasingly farther apart, but accuracy does not suffer as such data points reside on the more linear portions of the curve. Data storage requirements are thus minimized.

BRIEF DESCRIPTION OF THE DRAWINGS

FIG. 2 is a block diagram of a system constructed in accordance with the invention.

FIG. 3 is a more detailed block diagram of the microprocessor shown in FIG. 2.

FIG. 4 is a brief listing of values in the curve table of FIG. 3.

DETAILED DESCRIPTION OF THE INVENTION

Figure 1:
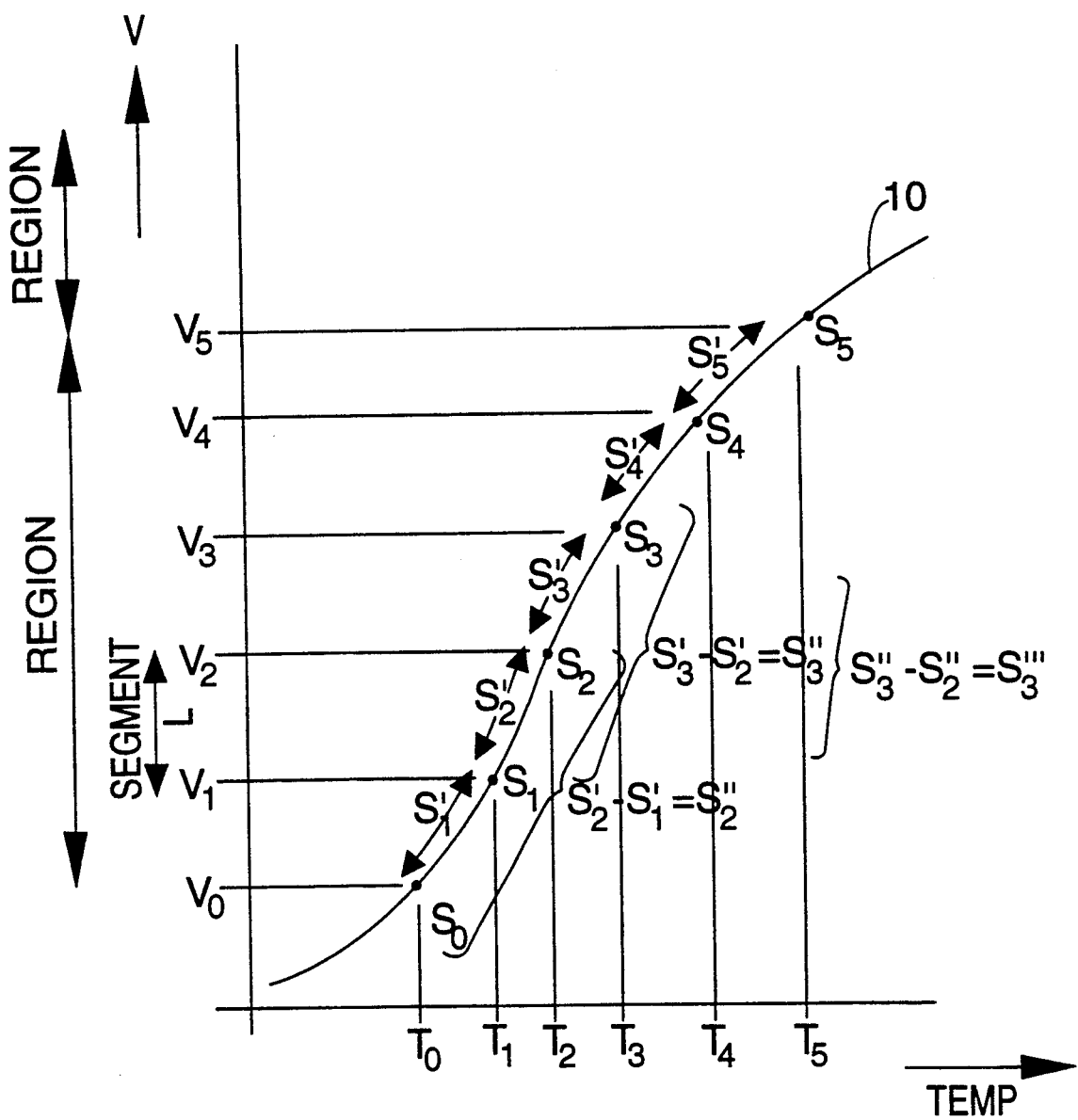
FIG. 1 is an exemplary showing of a voltage/temperature response curve of a sensor and indicates how first, second, and third finite-difference values are derived.

While the invention will be described in the context of a temperature sensing system, it is to be understood that it is equally applicable to any sensor whose output is a nonlinear function of an input stimulus and exhibits decreasing rates of change of curvature at higher output values.

Referring to FIG. 2, a sensor 20, which for this example is a thermocouple, provides its output to a signal conditioning circuit 22. Therein the signal is amplified, filtered if necessary, and passed to a sampling analog to digital (A/D) converter 24. A/D converter 24 is preferably a dual slope converter of the type known in the prior art. In brief, it samples the output of signal conditioning circuit 22 and during the sample time, integrates this signal, producing a ramp voltage whose value at the end of the sample time is proportional to the average input voltage level during the sample time. At the termination of the sample time, a reference voltage, applied via conductor 26, is switched into the integrator and an opposite slope ramp commences downward towards the ramp-starting voltage. At this time a count is initiated which terminates at the time when the ramp voltage decreases to the ramp-starting voltage. This equality is determined in comparator 30 by sensing the ramp voltage on line 32 and comparing it to the ramp-starting voltage on line 26. When the equality is sensed, an output pulse is impressed by comparator 30 on line 34 that causes the count to terminate. That pulse is also passed to microprocessor 28 as an indication that the count is complete, the count representing the sample voltage level. The sampling rate of A/D converter 24 is controlled by an output command appearing on line 36 from microprocessor 28.

As the voltage count is being generated, it is continually passed to microprocessor 28, where it is converted to temperature values S by a linearization program. Display 38, shortly after receipt of the pulse output from comparator 30 that the voltage count is final for the sample, displays the value S.

Turning now to FIG. 3, a block diagram is shown of microprocessor 28. An arithmetic logic unit (ALU) 50 communicates with other elements of the system via bus 52. The voltage count from A/D converter 24 is placed on bus 52 and is received and operated on by ALU 50. In addition, the output from comparator 30 is also applied to bus 52 and causes ALU 50 to provide an output to display 38 of the desired temperature value, when enabled by completion of the computation program. A plurality of registers 54, 56, 58, and 60 are coupled to bus 52 and are employed to store values of S, S', and S", during the operation of the linearization algorithm. The function of these registers will be considered during the description of the algorithm below.

A curve table is initially stored in ROM (Read-Only Memory) and brought to random access memory (RAM) 62 when the particular sensor type corresponding thereto is selected. While only one curve table will be hereinafter described, it is to be understood that RAM 62 can be sequentially loaded with any of a number of curve tables, each one specifically precalculated for a particular sensor type.

To better understand the contents of curve table 62, refer back to FIG. 1 where it will be recalled that curve 10 is a portion of a response curve of, in this instance, a temperature sensor. Assume further that data points $S_0$–$S_5$ represent the lowest temperature values capable of being sensed by the sensor and that curve 10 is at its most nonlinear between those data values. Thus, the portion of curve 10 between data values $S_0$–$S_5$ will hereinafter be defined as a "region" and the voltage difference between successive data points (e.g., $S_1$–$S_2$) will be defined as a "segment" L.

In the first region of curve 10, segments L are of an equal, small value. In each succeeding region, the size of segment L is doubled. The value of a segment L may start out at 32 microvolts, but for commonly-used thermocouples it could be as low as 8 microvolts or as high as 64 microvolts. Generally, the first region of curve 10 is assigned to its most nonlinear portion (generally near the lowest temperature sensitivity area) so that the smallest microvolt segments are assigned thereto and, as a result, a large number of small segments is assigned to the area of highest non-linearity. Thus, a nonlinear response curve is broken into a number of regions, each region having a number of segments, with succeeding higher regions on the response curve having successively doubled segment lengths. While a factor of 2 is herein described for the increases in segment value size, other easily stored factors could also be employed.

Referring now to FIG. 4, curve table 62 comprises, for the first region, a first datum equal to the starting output $S_0$, a second datum equal to the first finite-difference (slope) for the first segment $S_1'$, a third datum equal to the second finite-difference (curvature) for the second segment, $S_2''$, and a fourth value equal to the third finite difference (rate of change of curvature) for the third segment, $S_3'''$. The fifth and sixth table values are $S_4'''$ and $S_5'''$, respectively.

Starting with the seventh table value, each table datum is used thrice: i.e., the seventh datum = $S_6''' = S_7''' = S_8'''$, and the eighth datum = $S_9''' = S_{10}''' = S_{11}'''$, and so on. This "triad" compression is possible because the thermodynamic smoothing at higher temperatures reduces high-order derivatives to small, slowly changing values.

The lower derivatives also permit table compression in the allocated datum length: $S_0$ requires 3 bytes (eight bits each) for high accuracy, but $S_1$ through $S_6$ can be contained in two bytes, and $S_7'''$ through $S_9'''$ need only a one-byte datum. The next two table values ($S_{10}''' = S_{11}''' = S_{12}'''$ and $S_{13}''' = S_{14}''' = S_{15}'''$ require a nibble (4 bits) each, so they both fit into one table byte space. Beyond this point each triad datum requires only one nip (2 bits) of space, permitting very dense packing.

The higher derivatives continue to diminish with temperature, so that yet further data compression is possible by changing segment length. After $S_{39}'''$ is employed to calculate, a new region of the curve commences, in which each segment is twice the length of those in the first region (and yet each triad still requires only one nip of space). Further doubling of the segment length occurs after $S_{75}'''$, $S_{111}'''$, and $S_{159}'''$.

For example, if the segment length through $S_{39}'''$ was 32 microvolts, it increases to 64 microvolts through $S_{75}'''$, 28 microvolts through $S_{111}'''$, 256 microvolts through $S_{159}'''$, and finishes the curve at 512 microvolts (up to 256 segments total).

Using this arrangement, the curve table, in just 35 bytes, can store sufficient data to calculate temperatures to an accuracy of 0.1 degrees better for a range of over 1500 degrees or Celsius.

Figure 5:
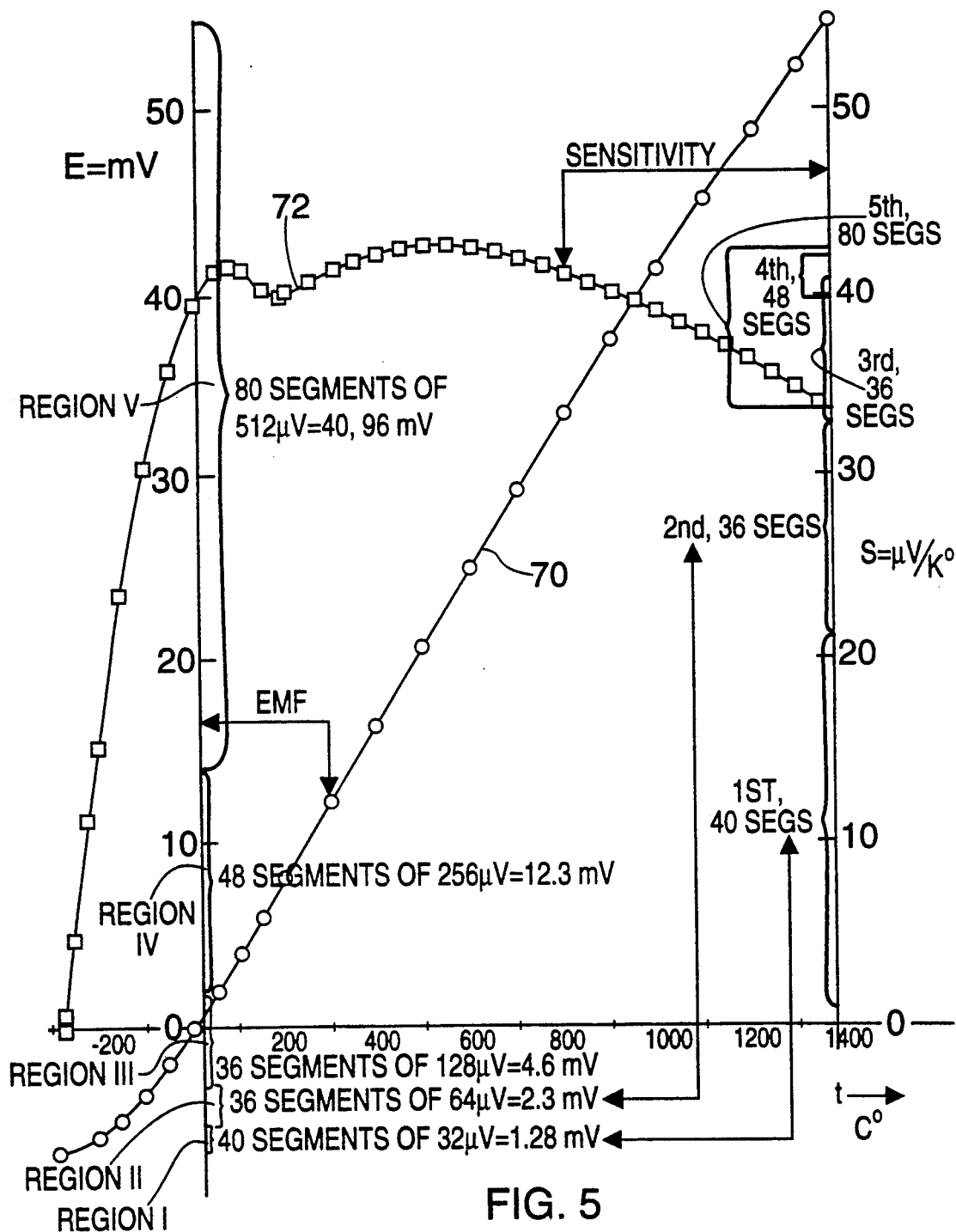
FIG. 5 is a diagram of a response curve of thermocouple voltage and sensitivity (dv/dt), and shows how this response curve is broken into regions with segments of increasing size at increasing temperatures.

Turning now to FIG. 5, curve 70, whose scale is on the left side of the figure is a plot of an actual thermocouple response curve ranging from approximately −270° C. to 1400° C. Curve 72, whose scale is on the right side of the figure, shows the change in sensor gain (microvolts per degree C.). The segment allocations to millivolt regions and the corresponding ranges of sensor gain illustrates the sensitivity of the invention over the indicated temperature range.

Turning now to FIGS. 6a–6d and FIG. 7, the operation of microprocessor 28 will be hereinafter described as it responds to input sample voltages received from A/D converter 24. As above stated, the curve table in RAM 62 is pre-loaded with a starting output data value $S_0$, a first finite-difference value $S_1'$ (slope), a second finite-difference value $S''_2$ (curvature) and a plurality of third finite-difference values, starting at $S'''_3$ (rate of change of curvature for the third segment).

As indicated at box 100, registers 54, 56, 58, and 60 are loaded with the initial values at the commencement of a measurement cycle. Next (see box 102), the segment value L is set equal to an initial microvolt value (a value equal to a count from a A/D converter 24). The value of L will determine when a new calculation occurs to establish a new data value along the response curve. As stated above, in succeeding regions of response curve 10, the value of L will be shifted to cause the data points to be spaced further apart.

Once the segment value L is established, microprocessor 28 continues to monitor the voltage value count (box 104) and to test whether the count is equal to (or larger than) L (box 106). Until the count does equal L, the monitoring action continues. Once the count is found to equal L, thus indicating that the first segment along response curve 10 has been traversed, a segment counter (not shown) within microprocessor 28 is set to equal 1 (box 108). The first finite-difference value $S_1'$ is then added to data point value $S_0$ to obtain $S_1$. the S register, 54, is updated to indicate the new value (box 110).

The system continues to monitor the voltage value count (box 112) and when the count equals 2 L (box 114), sets the segment counter equal to 2 (box 116). If, as indicated at box 114, the count is found not to equal 2 L, the procedure cycles back to box 112 where the voltage value continues to be monitored. At this point, the value of $S_2$ is to be determined and it is accomplished as shown in box 118. In specific, the value of the second finite-difference $S''_2$ stored in S" register 58 is added to the value of the first finite-difference $S_1'$ stored in S register 56, to obtain $S_2'$ (the slope between data points $S_1$ and $S_2$). The value of $S_2'$ replaces the value of $S_1'$ in S' register 56 and is added to the $S_1$ value in S register 54 to obtain a new data point value $S_2$. That value is written into the S register 54 in place of $S_1$.

The system then continues monitoring the voltage count (box 120) and when the count equals 3 L (box 122), it sets the segment counter equal to 3 box 124). If the count is found not to equal 3 L (box 122), the procedure cycles back to continue monitoring the voltage value (box 120). Assuming a count of 3 L is found, the system then calculates the value of a new data point, but now begins to use the stored third finite-difference values. As is shown in box 126, the value of $S_3'''$ stored in S''' register 60 is added to the value of $S_2''$ stored in S'' register 58, to obtain $S_3''$ (curvature of the response curve between data points $D_1$ and $D_3$). The $S''_3$ value is inserted into S'' register 58 and replaces the $S_2''$ value therein. The $S_3''$ value is then added to the $S_2'$ value in S' register 56 to obtain a new first finite-difference value $S_3'$ which is loaded into S' register 56. That value is then added to $S_2$ to obtain $S_3$ which is written into S register 54.

It can thus be seen that these calculations involve first, the calculation of a new second finite-difference from a stored third finite-difference; the calculation of a new first finite-difference from the thus calculated second finite-difference, and finally, the calculation of a new data point from the calculated first finite-difference added to a previous data point value.

Figure 6A:
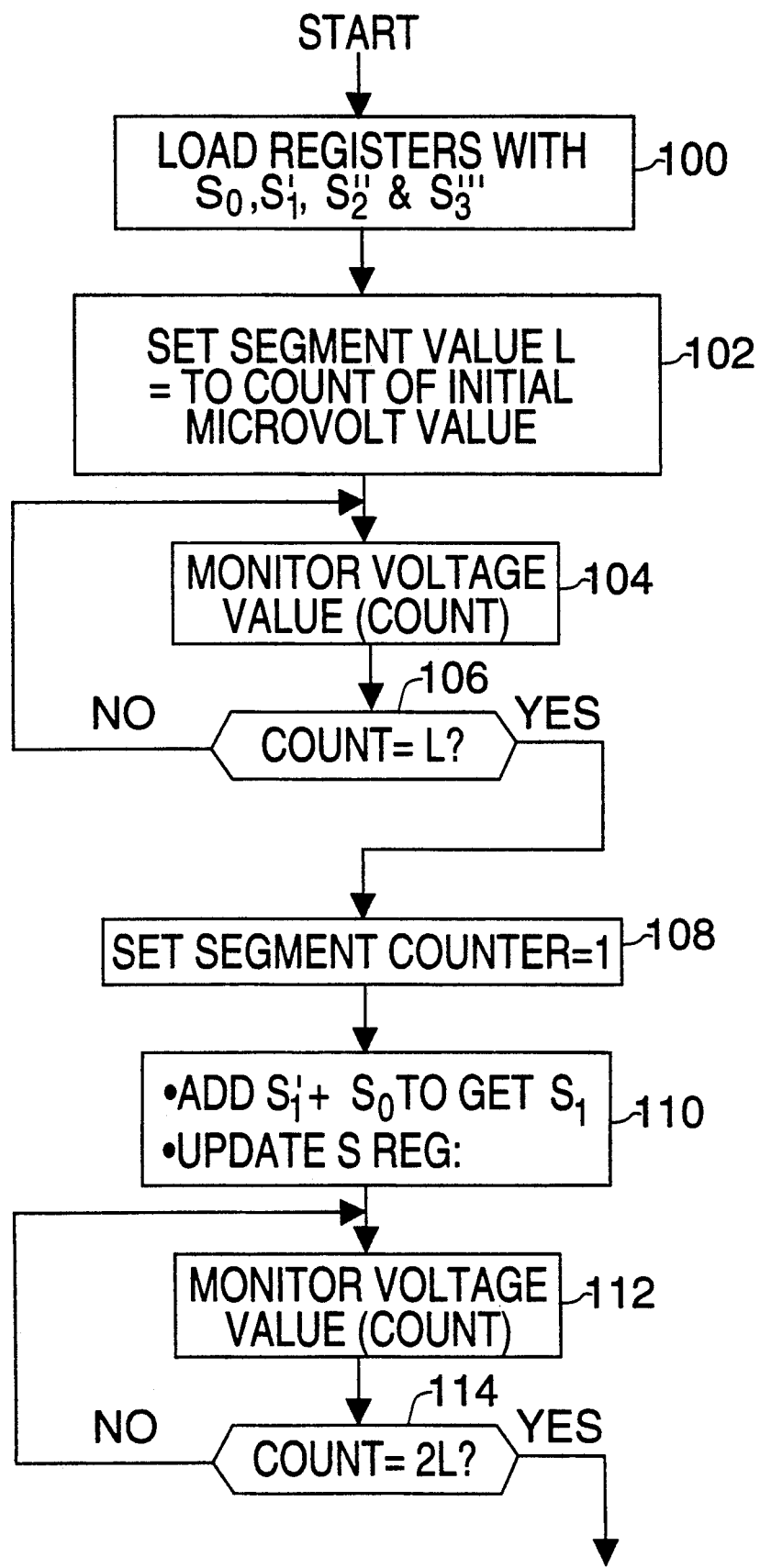
FIGS. 6a, 6b, 6d illustrate a high level flow diagram of the linearization method of the invention.
Figure 6B:
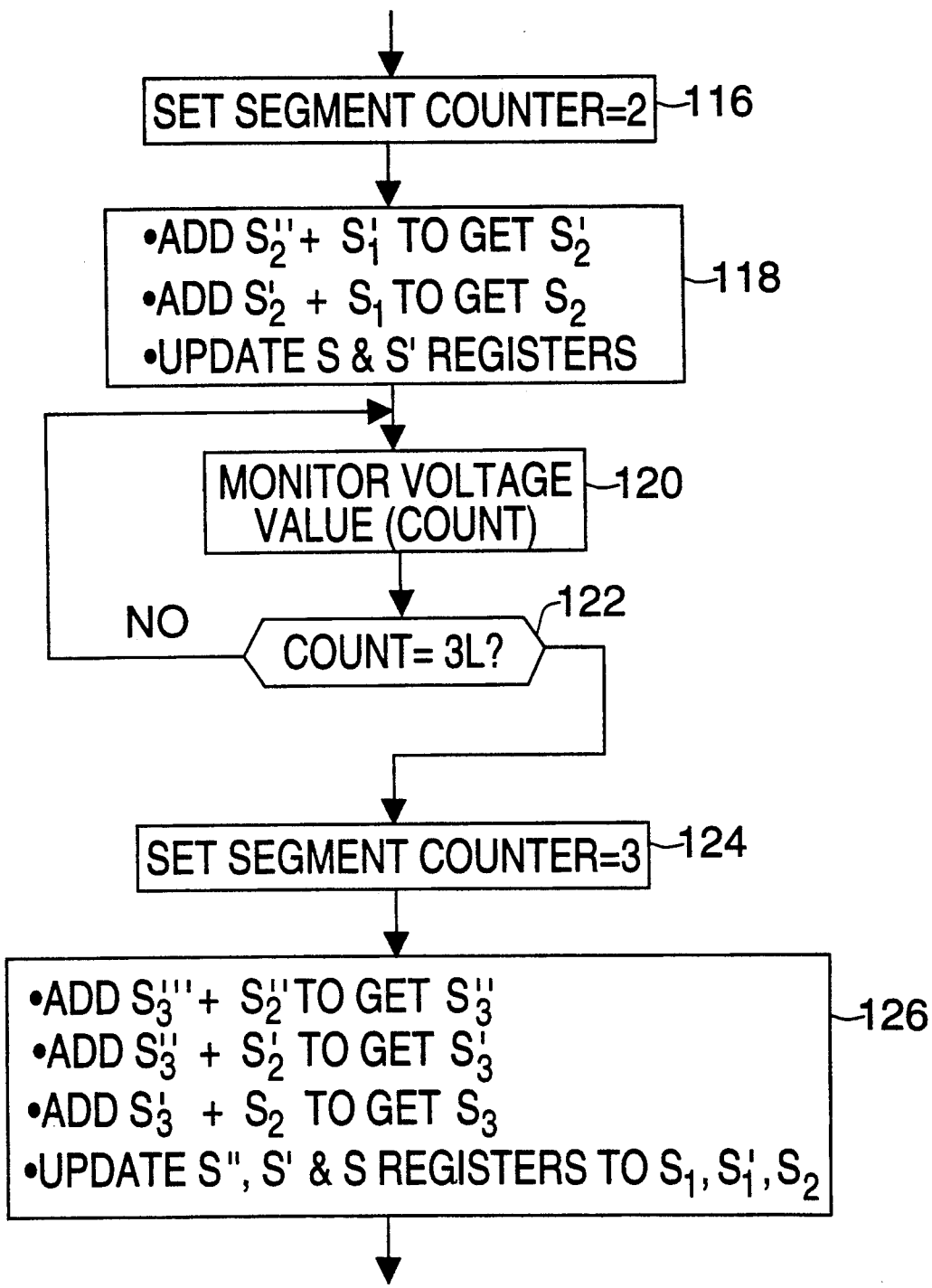
Figure 6C:
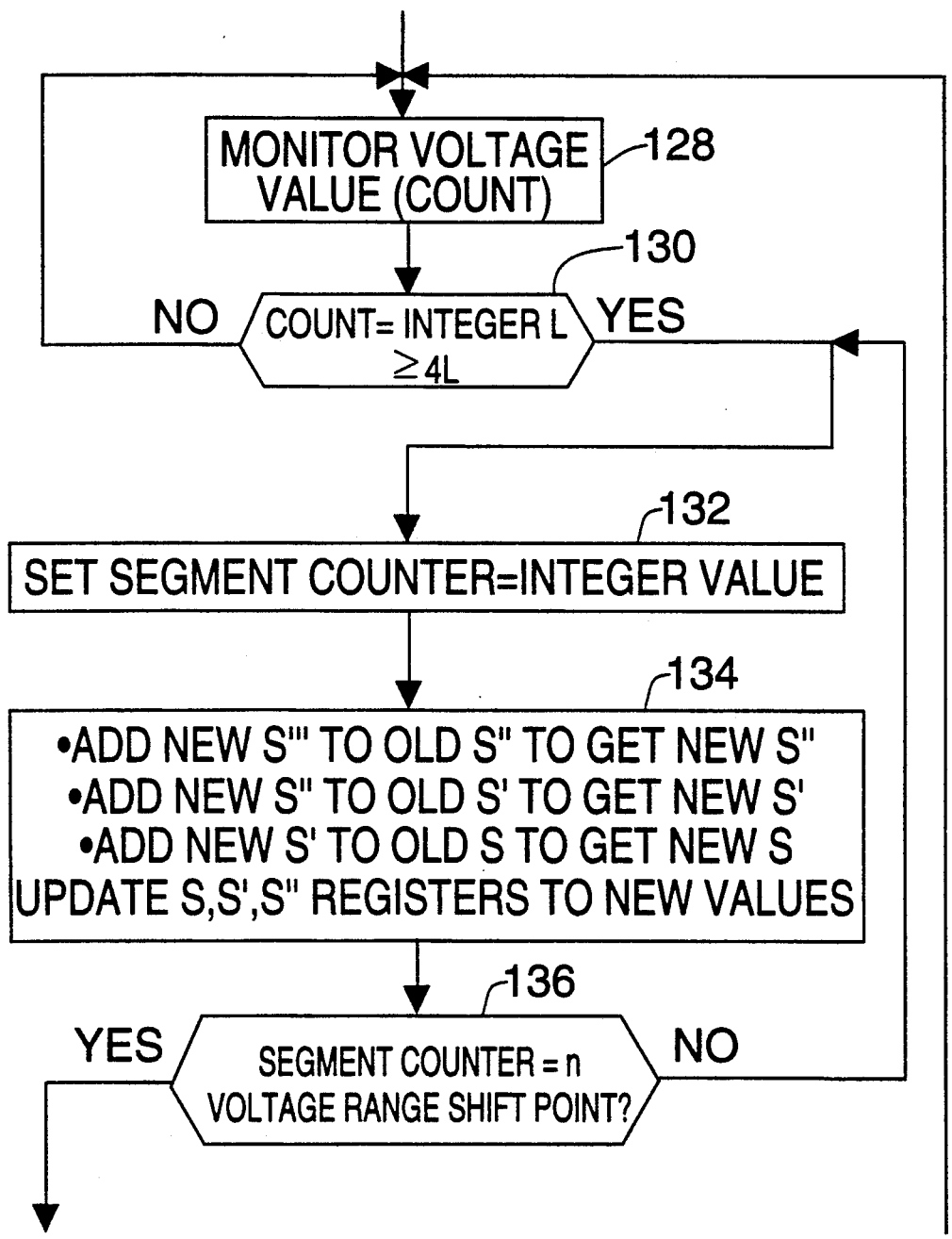

As shown in FIG. 6c, the procedure continues by monitoring the voltage value count (box 128) until it is determined that the count is an integer multiple of L and is equal to or greater than 4 L (box 130). As above, until the count is found to be greater than or equal to 4 L, the procedure continues to monitor the voltage value (box 128). Once the aforesaid test is met, the segment counter is set equal to the integer value (box 132) and the aforestated calculation is repeated to obtain the new data point value. The rules are indicated in box 134 and are as follows: (1) Add the new value of S''' to the old value of S'' to get the new S'' value. (2) Add the new value of S'' to the old value of S' to get the new S'. (3) Add the new value of S' to the old S value to get the new S value. Once these values are obtained, the S, S', and S'' registers are updated and a new S''' value is obtained from the curve table in RAM 62 in preparation of the next calculation cycle. It can thus be seen that the storage of third finite-difference values enable many data points to be calculated and reduces the amount of storage required in curve table 62.

To further reduce the amount of storage required in curve table 62, the sizes of segments L are increased as the system proceeds up the response curve. This is accomplished by interrogating the segment counter in microprocessor 28 to determine whether its count equals a voltage range shift point (decision box 136). If not, the program recycles to box 132 and continues as shown. If the segment counter does indicate a voltage range shift point, e.g., $S_n$, then the system accesses the third finite-difference value, $S_n'''$ corresponding to that data point (box 140).

Figure 6D:
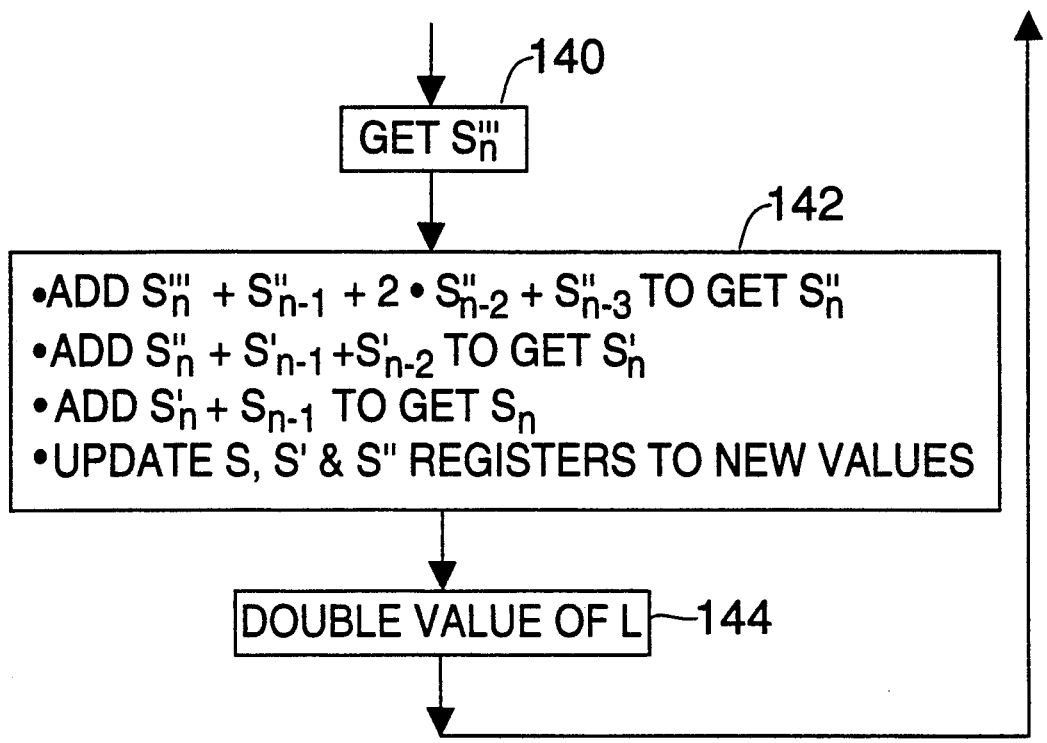

As can be seen from FIG. 6d, the system then doubles the value of L (box 144) and proceeds to monitor the voltage and continue the calculations as shown in FIG. 6c. It is to be realized, however, that when the segment value L is doubled, it is necessary to modify the values in registers 54, 56, and 58 to prevent discontinuities from occurring at a voltage range shift point. To accomplish this, the calculations occur as shown in box 142 and comprise the following. To obtain a new second finite-difference $S_n''$ (n=the data point number at the shift point), the accessed value of $S_n'''$ (third finite-difference) is added to $S_{n-1}''+2S_{n-2}''+S''_{n-3}$. The new value of $S''_n$ is then added to $S_{n-1}'+S_{n-2}'$ to obtain a new first finite-difference value $S_n'$. To obtain the new data point $S_n$, the newly calculated data value of $S_n'$ is added to $S_{n-1}$. From these calculations, it can be seen that ALU 50 must retain in its memory, as calculations proceed, the values for the prior two second finite-differences and the penultimate first finite-difference, as well as the values in registers 54, 56, and 58.

The newly calculated value $S_n''$, $S_n'$ and $S_n$ now are loaded into registers 54, 56, and 58, and the system is then prepared to continue monitoring the voltage and determining data point values as shown in FIG. 6c, until a new voltage range shift point occurs, at which point the registers are again updated as indicated.

Figure 7:
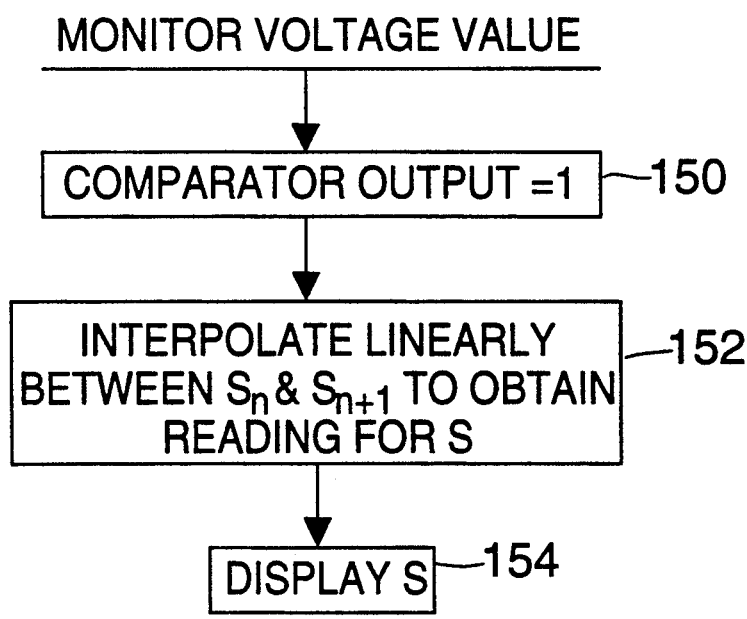
FIG. 7 is a detailed sub-flow diagram of a portion of the procedure of shown in FIGS. 6a–6d.

During the monitor voltage operation, as shown in FIG. 7, microprocessor 28 continues to await a pulse output from comparator 30 (box 150) which indicates that the voltage output count from A/D converter 24 has reached the reference voltage (end of sample time). At this point, the value of the voltage count is captured and, if it does not overlay a data point exactly (as is usual), but lies between a pair of data points $S_n$ and $S_{n+1}$, its value is linearly interpolated therebetween to obtain a reading for S (box 152). It is well within the realm of one skilled in the art to determine a following phenomenon data value from the values stored in the registers in FIG. 3. This will allow an interpolation to be performed, if an interpolation is required. That value is then displayed (box 154) on display 38.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. Processor apparatus for monitoring a sensor output signal that follows a nonlinear curve in response to linear changes in a monitored phenomenon, and for converting said sensor output signal to phenomenon data point values, the combination comprising:

memory means for storing a table including an initial data point value $S_0$ on said curve, an initial slope value $S_1'$ to another data point value $S_1$ on said curve, an initial curvature value $S_2''$ to a further data point value $S_2$ on said curve, and a plurality of rate-of-change-of-curvature values $S_n'''$ for said curve, a said value of $S_n'''$ for an initial region of said curve derived based on a sensor output signal initial increment value, and values of $S_n'''$ for succeeding regions of said curve derived based upon multiples of said initial increment value;

comparator means responsive to said sensor output signal to provide a segment signal indication when said sensor output signal changes by a determined amount;

detector means responsive to a count of said segment signals to indicate an entry of said sensor output into another region of said curve;

means responsive to said indication from said detector means for controlling said detector means to issue said indication of entry in response to a different count of said segment signals; and computation means responsive to each said segment signal indication from said comparator means for outputting a phenomenon data value $S_n$, said value $S_n$ derived by adding a value $S_n'''$ to a value $S_{n-1}'''$ to obtain a value $S_n''$, and adding said value $S_n''$ and $S_{n-1}'$ to obtain a value $S_n'$, and adding said value $S_n'$ and a value $S_{n-1}$ to obtain said data value $S_n$.

2. The processor apparatus as recited in claim 1 wherein said computation means is responsive to a said sensor output signal exceeding a phenomenon data point value $S_n$, to determine a further phenomenon data point value $S_{n+1}$ from stored values of $S_n$, $S_n'$, $S_n''$ and $S_n'''$, and to interpolate between $S_n$ and $S_{n+1}$ to obtain a phenomenon data point value equal to said sensor output signal.

3. The processor apparatus as recited in claim 1 wherein said responsive means causes a doubling of said count of said segment signal upon each indication from said detector means of an entry of said sensor output into another higher region of said curve.

4. The processor apparatus as recited in claim 3 wherein said detector means produces a count each time said comparator means provides a segment signal, so as to maintain a cumulative count of said segment signals, said detector means further providing an output indication of an entry of said sensor output into another region of said curve when said count of segment signals reaches a predetermined value for a said segment of said curve.

5. The invention as recited in claim 4 wherein said count values are chosen so that regions of said curve which are more nonlinear are described by larger numbers of smaller signal changes than for equal regions of more linear curve areas.

6. The processor apparatus as recited in claim 4 wherein said computation means computes said output data values $S_n$ by repeated additions of said values $S_n'''$, $S_n''$, $S_n'$ and $S_n$.

7. The processor apparatus as recited in claim 6 wherein said computation means, upon said sensor output signal value having risen into a succeeding curve portion delimited by a data point value $S_n$, performs a further series of calculations as follows:

adds $S_n''' + S_{n-1}'' + S_{n-2}'' + S_{n-3}''$ to obtain a new $S_n''$;

adds $S_n'' + S_{n-1}' + S_{n-2}'$ to obtain a new $S_n'$; and adds new $S_n' + S_{n-1}'$ to obtain a new value of $S_n$.

* * * * *